US012757774B2

(12) United States Patent
Marin et al.

(10) Patent No.: US 12,757,774 B2
(45) Date of Patent: Oct. 6, 2026

(54) SILICON NITRIDE LAYER UNDER A COPPER PAD

(71) Applicant: Intel Corporation, Santa Clara, CA (US)

(72) Inventors: Brandon C. Marin, Gilbert, AZ (US); Suddhasattwa Nad, Chandler, AZ (US); Srinivas V. Pietambaram, Chandler, AZ (US); Gang Duan, Chandler, AZ (US); Jeremy D. Ecton, Gilbert, AZ (US); Kristof Darmawikarta, Chandler, AZ (US); Sameer Paital, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 190 days.

(21) Appl. No.: 17/848,624

(22) Filed: Jun. 24, 2022

(65) Prior Publication Data

US 2023/0420357 A1 Dec. 28, 2023

(51) Int. Cl.
*H10W 70/69* (2026.01)
*H10P 14/694* (2026.01)
(Continued)

(52) U.S. Cl.
CPC ....... *H10W 70/69* (2026.01); *H10P 14/69433* (2026.01); *H10W 70/095* (2026.01);
(Continued)

(58) Field of Classification Search
CPC ........... H01L 23/49827; H01L 23/5384; H01L 23/5383; H01L 23/5386; H01L 23/538–5389; H01L 23/498–49894; H01L 23/32; H01L 23/3121; H01L 21/0217; H01L 21/486; H01L 23/49811; H01L 24/16; H01L 2224/16227; H01L 2924/15313; H01L 2924/30105; H01L 2924/3512; H10W 70/69; H10W 70/685; H10P 14/6943–69433
See application file for complete search history.

(56) References Cited

U.S. PATENT DOCUMENTS

2016/0358847 A1* 12/2016 Shih ........................ H10P 72/74
2023/0307340 A1* 9/2023 Heo .................. H01L 23/49894
(Continued)

FOREIGN PATENT DOCUMENTS

KR 20230138318 A * 10/2023 ............. H01L 24/07
WO WO-2022022419 A1 * 2/2022 ....... H01L 23/49822

*Primary Examiner* — Evan G Clinton
(74) *Attorney, Agent, or Firm* — Schwabe, Williamson & Wyatt, P.C.

(57) ABSTRACT

Embodiments herein relate to systems, apparatuses, or processes directed to forming an LGA pad on a side of a substrate, with a layer of silicon nitride between the LGA pad and a dielectric layer of the substrate. The LGA pad may have a reduced footprint, or a reduced lateral dimension with respect to a plane of the substrate, as compared to legacy LGA pads to reduce insertion loss by reducing the resulting capacitance between the reduced LGA footprint and metal routings within the substrate. The layer of silicon nitride may provide additional mechanical support for the reduced footprint. Other embodiments may be described and/or claimed.

24 Claims, 10 Drawing Sheets

(51) Int. Cl.

| | |
|---|---|
| ***H10W 70/05*** | (2026.01) |
| ***H10W 70/65*** | (2026.01) |
| ***H10W 70/685*** | (2026.01) |
| ***H10W 90/00*** | (2026.01) |

(52) U.S. Cl.

CPC ......... *H10W 70/65* (2026.01); *H10W 70/685* (2026.01); *H10W 90/701* (2026.01); *H10W 90/724* (2026.01)

(56) References Cited

U.S. PATENT DOCUMENTS

2023/0411268 A1* 12/2023 Yoo ......................... H01L 24/32
2023/0411275 A1* 12/2023 Kang .................. H01L 23/3128

* cited by examiner

SILICON NITRIDE LAYER UNDER A COPPER PAD

FIELD

Embodiments of the present disclosure generally relate to the field of package assemblies, and in particular package assemblies that include a land grid array (LGA).

BACKGROUND

Continued reduction in end product size of mobile electronic devices such as smart phones and ultrabooks is a driving force for the development of reduced-size system in package components. Part of this reduction includes increasing the density of LGA surface mount technology while reducing the insertion loss on the LGA side of a package substrate.

DETAILED DESCRIPTION

Figure 1:
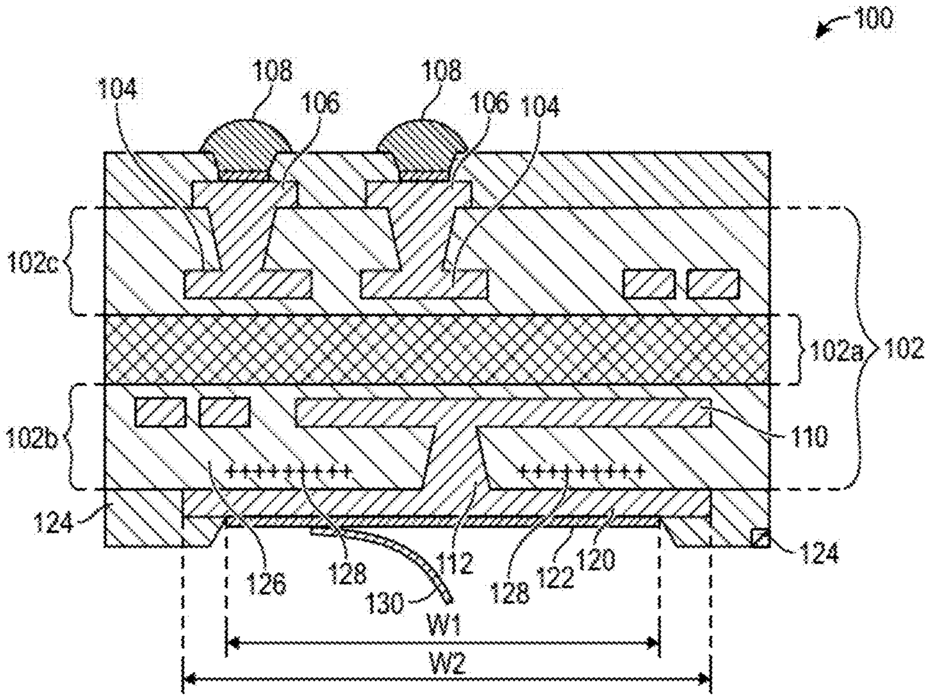
FIG. 1 illustrates a cross section side view of a legacy substrate that includes an LGA pad.

Embodiments of the present disclosure may generally relate to systems, apparatus, techniques, and/or processes directed to forming an LGA pad on a side of the substrate, with a layer of silicon nitride between the LGA pad and a dielectric layer of the substrate. In embodiments, the LGA pad may have a reduced footprint, or a reduced lateral dimension with respect to a plane of the substrate, as compared to legacy LGA pads. This reduction in footprint may contribute to a reduction in insertion loss by reducing the resulting capacitance between the reduced footprint LGA pad and metal routings within the substrate.

In embodiments, a layer of silicon nitride may be placed between a side of the LGA pad and a dielectric of the substrate, in order to provide additional mechanical stability for the LGA pad and the dielectric near the edge of the LGA pad. In embodiments, the layer of silicon nitride, which has a higher modulus, may extend beyond the edge of the LGA pad and along at least a portion of the surface of the substrate. The layer of silicon nitride may provide a stress relief layer that facilitates additional mechanical stability to prevent cracks or fatiguing from developing at or near the edge of the LGA pad.

In embodiments, the layer of silicon nitride may include $Si_3N_4$, or other similar stoichiometries, that enables the layer of silicon nitride to have a higher dielectric constant (Dk), as compared to the Dk of a dielectric that may partially surround the layer of silicon nitride. The higher Dk of the layer of silicon nitride will also reduce capacitance, resulting in further decreased insertion loss for the LGA pad.

In embodiments, a solder resist opening associated with the LGA may be larger than the reduced LGA footprint. In embodiments, the solder resist opening may be of a legacy dimension. In these embodiments, the wider solder resist opening will ensure that pins of devices coupled with the LGA pad will accurately seat, and the reduced footprint of the LGA pad will decrease capacitance and therefore decrease insertion loss of the LGA pad.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

FIG. 1 illustrates a cross section side view of a legacy substrate that includes an LGA pad. Legacy package 100 includes a substrate 102 that may have a core 102*a*. A first buildup layer 102*b* may be on a first side of the core 102*a*, and a second buildup layer 102*c* may be on a second side of the core 102*a*. The second buildup layer 102*c* may include a number of electrical routings features 104 that may include routings within layers of the second buildup layer 102*c* as well as vertical connections, such as copper filled vias, that electrically couple with pads 106 on a side of the second buildup layer 102*c*. Solder balls 108 may be electrically coupled with the pads 106. The solder balls 108 may be used to form connections with other devices, such as dies (not shown) electrically and physically coupled with the substrate 102. In implementations, the solder balls 108 may form a portion of a first level interconnect (FLI) of the legacy package 100.

The first buildup layer 102*b* may include various electrical routings 110 that may be electrically coupled with a metal defined pad 120, using a copper filled via 112. In implementations, the copper filled via 112 may be some other electrical routings feature. The metal defined pad 120 may be on a surface of the second buildup layer 102*b*. In implementations, an ENEPIG (electroless nickel electroless palladium immersion gold) layer 122 may be placed on a surface of the metal defined pad 120. In implementations, the metal defined pad 120 may be used as an LGA pad. In implementations, the metal defined pad 120 may form a portion of a second level interconnect (SLI) of the legacy package 100 to which an LGA pin 130 may physically attach.

A solder resist layer 124 may be placed on a surface of the first buildup layer 102*b* and partially surround the metal defined pad 120. The metal defined pad 120 may have an overall width W2, and a pad width W1 for a conductive surface of the metal defined pad 120 that is able to electrically couple with an LGA pin 130. The electrical routings 110 may be parallel to the metal defined pad 120 and may overlap the pad as shown. The dielectric 126 within the first buildup layer 102*b* may be between the electrical routings 110 and the metal defined pad 120. During operation, the combination of the electrical routings 110 and the defined metal pad 120 will form a capacitive structure, with electrical charges 128 building up on a surface of the defined metal pad 120. The electrical charges 128 may cause an increased insertion loss, or power loss, that reduces the power received by the legacy package 100 from the LGA pin 130.

Figure 2:
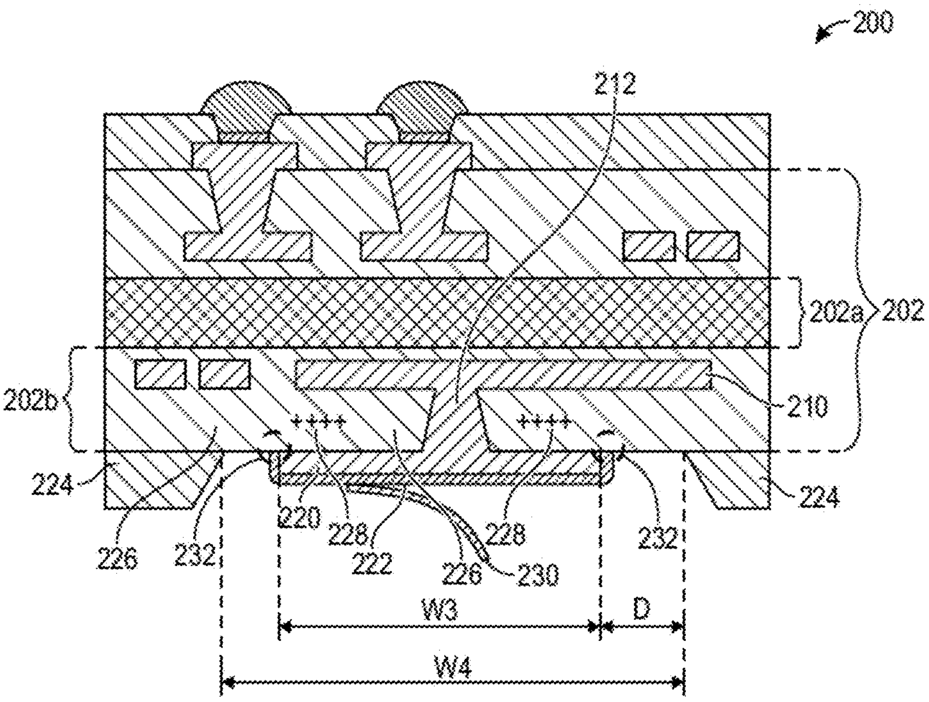
FIG. 2 illustrates a cross section side view of a substrate that includes an LGA pad with a reduced footprint, in accordance with various embodiments.

FIG. 2 illustrates a cross section side view of a substrate that includes an LGA pad with a reduced footprint, in accordance with various embodiments. Package 200, which may be similar to legacy package 100 of FIG. 1, shows an embodiment of a reduced-sized metal defined pad on a substrate 202. In embodiments, the substrate 202 may have a core 202*a*. In embodiments, the core 202*a* may be, for example, a glass core, a ceramic core, or a copper clad laminate (CCL) core.

A first buildup layer 202*b* may be on a side of the core 202*a*, and include various electrical routings 210 that may be electrically coupled with a metal defined pad 220, using a copper filled via 212. In embodiments, these may be similar to first buildup layer 102*b*, core 102*a*, electrical routings 110, and copper filled via 112 of FIG. 1. In embodiments, the copper filled via 212 may be some other electrical routing feature. The metal defined pad 220 may be on a surface of the first buildup layer 202*b*. The thickness of the metal defined pad 220 can be between 5 and 50 um. In embodiments, an ENEPIG layer 222 may be placed on a surface of the metal defined pad 220. In embodiments, the metal defined pad 220 may be used as an LGA pad. In embodiments, the metal defined pad 220 may form a portion of a SLI of the package 200 to which an LGA pin 230 may physically and electrically couple.

A solder resist layer 224 may be placed on the surface of the first buildup layer 202*b*, and away from the metal defined pad 220. The metal defined pad 220 may have an overall width W3, while the overall socket width may be W4. In embodiments, the socket width may be similar to pad width W2 of FIG. 1, in order to accommodate a high-quality electrical connection between the LGA pin 230 and the metal defined pad 220. In embodiments, the solder resist layer 224 may be separated from the metal defined pad 220 by a distance D.

Note that the width W3 of the metal defined pad 220 may be less than the width W1 of the metal defined pad 120 of FIG. 1. The reduction of width W3 of metal defined pad 220 will result in a lower capacitance 228 that is formed in the capacitive structure created by the electrical routings 210, the defined metal pad 220, and dielectric 226. This is due in part to reducing the capacitive area of the metal defined pad 220.

However, in embodiments, the areas 232 of the package 200 that may be at an edge of the defined metal pad 220 and the dielectric 226 may be subject to fatigue and/or stress cracking. This is due, in part, to the different coefficients of thermal expansion (CTE) of the metal pad 220 and the dielectric 226. Note in legacy package 100 of FIG. 1, a portion of the solder resist layer 124 overlaps a portion of the defined metal pad 120, causing a portion of the defined metal pad 120 to be between solder resist layer 124 and a dielectric 128. This overlap provides additional mechanical support against fatigue or cracking of the defined metal pad 120.

Figure 3A:
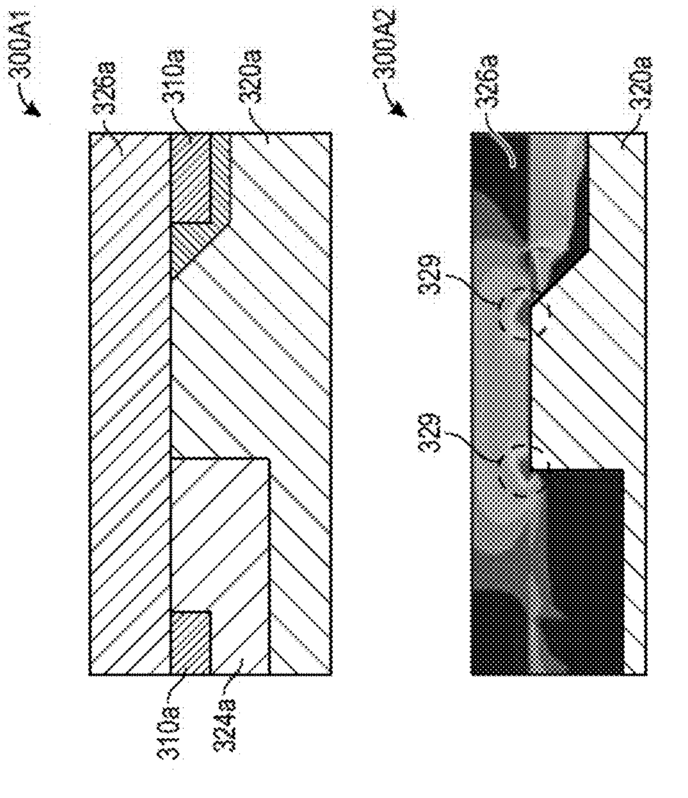
FIGS. 3A-3B graphically illustrate stress build up on a metal pad against a dielectric.
Figure 3B:
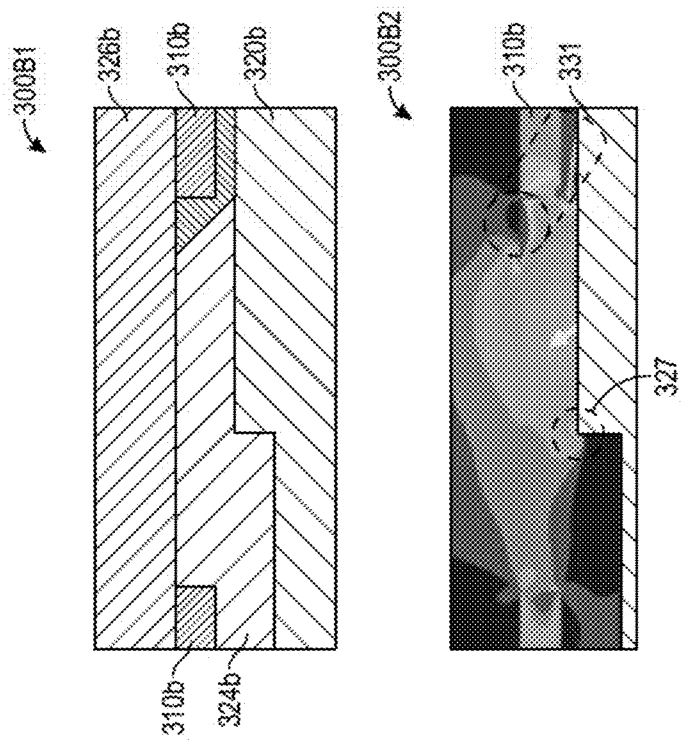

FIGS. 3A-3B graphically illustrate stress build up on a metal pad against a dielectric. FIG. 3A shows a cross section side view of a substrate portion 300A1, which may be similar to portions of legacy substrate 100 of FIG. 1 that includes a copper pad 320*a* that is underneath and connected to a dielectric layer 326*a*. Other copper routings 310*a* may be under the dielectric layer 326*a*. The metal in the copper pad 320*a* directly contacts the dielectric layer 326*a*. A solder resist layer 324*a* may be to a side of the copper pad 320*a*. Diagram 300A2 shows an example of a mechanical stress diagram, which shows that the stress areas 329 in corners of the copper pad 320*a* that meet with the dielectric layer 326*a* show a maximum amount of stress. This stress may be due to high amounts of torsion by the copper pad 320*a* on the underlying dielectric 326*a*, due to thermal expansion. Under the legacy architecture in FIG. 1, the stress is usually attenuated by the overlap of layer 124 on the underlying copper pad. However, when there is a free surface, the stress propagates into the underlying dielectric layer.

FIG. 3B shows a cross section side view of a substrate portion 300B1, which may be similar to portions of legacy substrate 100 of FIG. 1, that includes a copper pad 320*b*, and a solder resist layer 324*b* above the copper pad 320*b* and below the dielectric layer 326*b*. Other copper routings 310*b* may be under the dielectric layer 326*b*. Diagram 300B2 shows an example of a mechanical stress diagram, where, compared to diagram 300A2, stress area 327 is significantly reduced compared to stress areas 329 due to the existence of the solder resist layer 324*b* to provide additional mechanical stability between the copper pad 320*b* and the dielectric layer 326*b*. Note that stress areas 331 shows as high, but these are in areas that do not include the solder resist layer 324*b*.

Figure 4A:
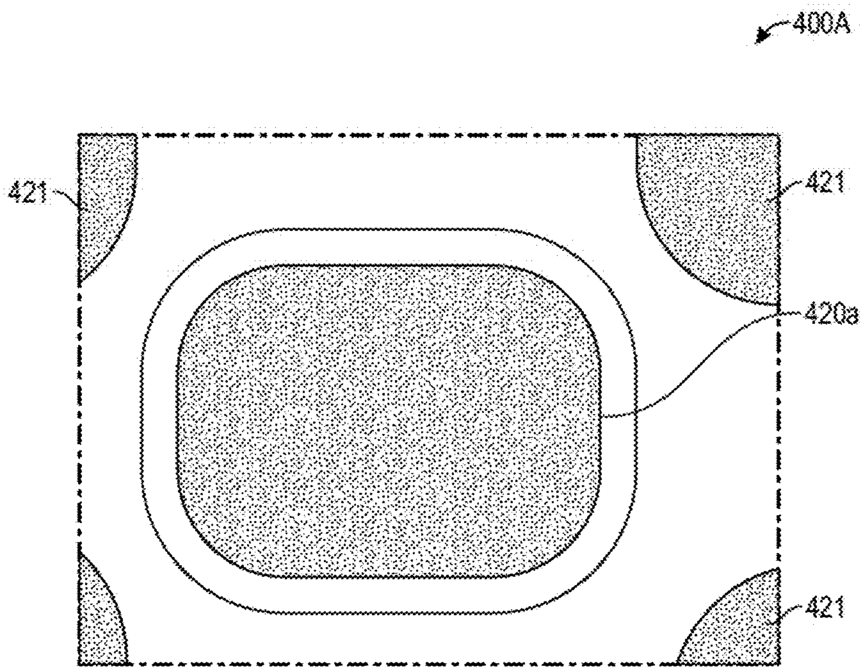
FIGS. 4A-4D show examples of stress cracks in traces.

FIGS. 4A-4D show examples of stress cracks in traces. FIG. 4A shows diagram 400A that is a top-down cross section view of a metal defined pad 420*a*, which may be similar to metal defined pad 120 of FIG. 1. Other portions of metal defined pads 421 may surround the metal defined pad 420*a*.

Figure 4B:
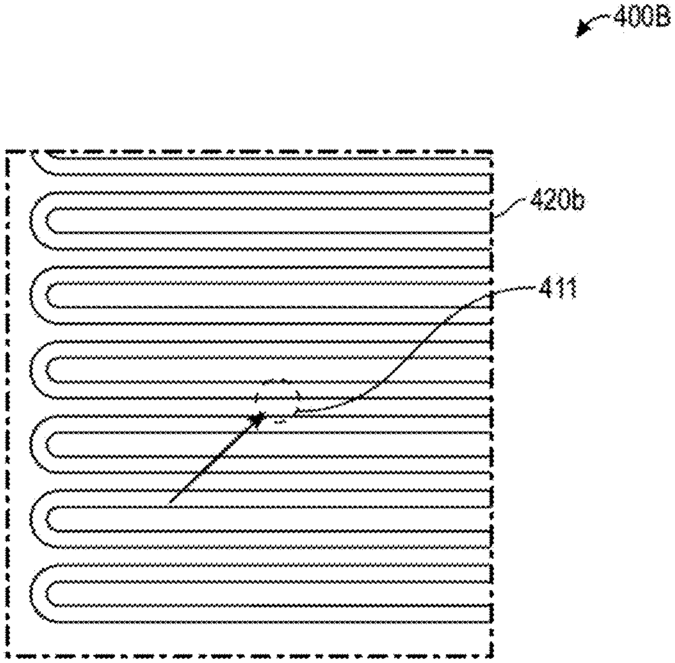

FIG. 4B shows diagram 400B that is an x-ray cross section that shows a crack 411 within a metal pad 420*b*, which may be similar to 420*a* of FIG. 4A.

Figure 4C:
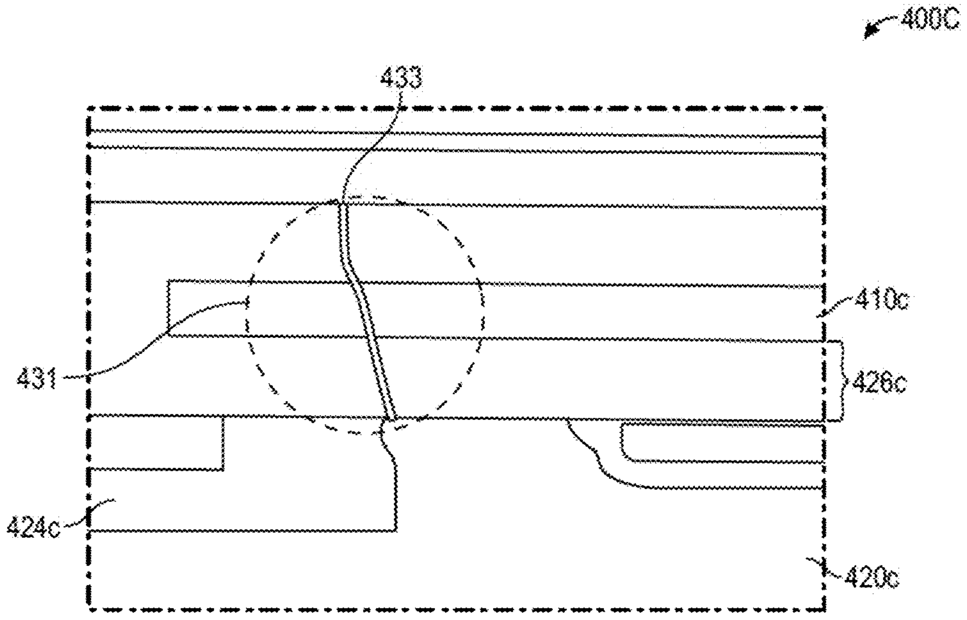

FIG. 4C shows diagram 400C which is an x-ray side view cross section of a substrate that includes a metal pad 420*c*, solder resist 424*c* next to a portion of the metal pad 420*c*, a dielectric layer 426*c* above the solder resist 424*c* and the metal pad 420*c*. Note that the metal of the metal pad 420*c* is in direct contact with the dielectric layer 426*c*. As shown, a crack has initiated at location 431 between the copper pad 420*c*, the dielectric layer 426*c* and the solder resist 424*c*, and extends through region 433, including through a trace layer 410*c*, which may be similar to electrical routings 110 of FIG. 1.

Figure 4D:
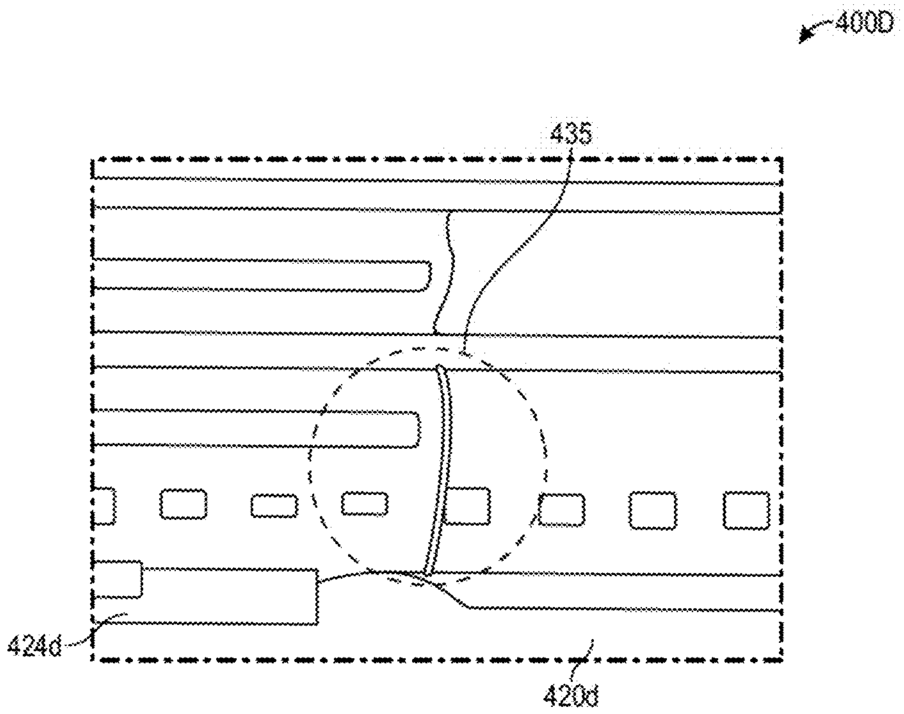

FIG. 4D shows diagram 400D which is an x-ray side view cross section of a substrate that includes a metal pad 420*d*, and solder resist 424*d* next to the metal pad 420*d*. A crack 435 has extended from a corner of the metal pad 420*d* and into the substrate.

Figure 5:
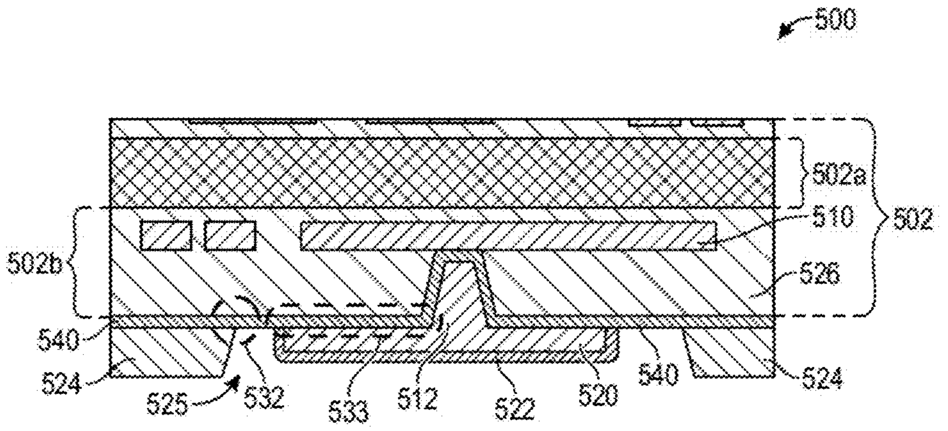
FIG. 5 illustrates a cross section side view of a substrate that includes a layer of silicon nitride between a dielectric layer and an LGA pad with a reduced footprint, in accordance with various embodiments.

FIG. 5 illustrates a cross section side view of a substrate that includes a layer of silicon nitride between a dielectric layer and an LGA pad with a reduced footprint, in accordance with various embodiments. Partial package 500 shows a cross section side view that includes a portion of the substrate 502, with a substrate core 502*a* and build up layers 502*b*. Build-up layers 502*b* include electrical routings 510 that may be electrically coupled with a metal defined pad 520 using a copper filled via 512. These may be similar to first build-up layer 202*b*, electrical routings 210, metal defined pad 220, and copper filled via 212 of FIG. 2.

The metal defined pad 520 may be on a surface of the second buildup layer 502*b*. In embodiments, an ENEPIG layer 522 may be placed on a surface of the metal defined pad 520. In embodiments, the metal defined pad 520 may be used as an LGA pad. A solder resist layer 524 may be placed on the surface of the buildup layer 502*b*. In embodiments, the solder resist layer 524 may not physically couple with the metal defined pad 520, and may at least partially surround the metal defined pad 520 to form a solder resist opening (SRO) 525. Solder resist layer 524 may be similar to solder resist layer 224 of FIG. 2.

In embodiments, a silicon nitride layer 540 may be placed on a surface of the buildup layer 502*b*, and may be beneath the metal defined pad 520 and may be beneath the solder resist layer 524. In embodiments, the silicon nitride layer may extend at least partially up the sides of the copper filled via 512. In embodiments, the silicon nitride layer 540 may include various stoichiometries $Si_xN_y$, where X and Y are integers that are greater than zero. In embodiments, a stoichiometry $Si_3N_4$ may provide a lowest dielectric constant (Dk) for the silicon nitride layer 540, and may also facilitate reduction of capacitance between the defined metal pad 520 and the electrical routings 510. In embodiments, the Dk for the silicon nitride layer 540 may be around 3.1, versus a Dk of the dielectric 526 that may be around 3.5 to 3.8. Thus, by adding the silicon nitride layer 540, the Dk of the material between metal defined pad 520 and the electrical routings 510 will be lower than if the silicon nitride layer 540 is not used.

Silicon nitride is a high modulus and stiff material, and resists cracking. In embodiments, silicon nitride may form a mechanically robust film. The solder resist layer 524, which may include ABF, may include polymers or amorphous materials that are grouped into macro molecules that are stacked on each other. Although this provides flexibility in the solder resist layer 524, it is brittle. However, silicon nitride is an amorphous, almost crystalline material that has properties similar to a metal, for example being ductile, have a high modulus, and is capable of withstanding mechanical stress.

In embodiments, the silicon nitride layer 540 may range from 50 nm to 1 μm. A common range may be between 100 and 200 nm. In embodiments, a thickness of the silicon nitride layer 540 may vary +/−25 nm. In embodiments, silicon nitride is an insulator, so the silicon nitride layer 540 will typically not completely surround the copper filled via 512.

In particular, the silicon nitride layer 540 may be particularly useful at stress areas. In particular, stress area 532 where an edge of the solder resist layer 524 would normally meet with the dielectric 526, and stress area 533, where the metal defined pad 520 would ordinarily interface with the dielectric 526.

Figure 6A:
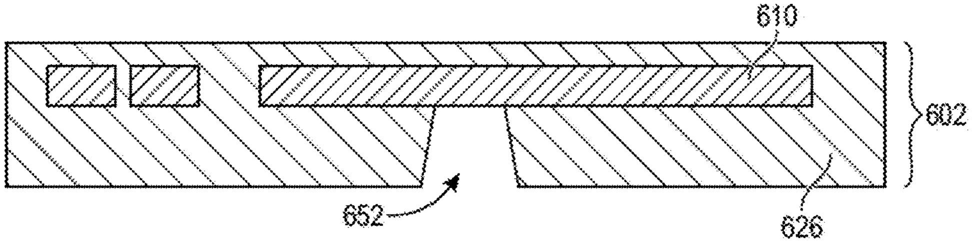
FIGS. 6A-6F illustrate cross section side views of stages in a manufacturing process for creating a layer of silicon nitride between an LGA pad and a dielectric, in accordance with various embodiments.

FIGS. 6A-6F illustrate cross section side views of stages in a manufacturing process for creating a layer of silicon nitride between an LGA pad and a dielectric, in accordance with various embodiments. FIG. 6A shows a cross section side view of a stage in the manufacturing process where a substrate 602 is provided, that includes electrical routings 610, which may be similar to electrical routings 510 of FIG. 5. In embodiments, a dielectric 626 may be included within layers of the substrate 602. In embodiments, a cavity 652, which may also be referred to as a via, may be drilled into a side of the substrate 602 to expose a portion of the surface of the electrical routings 610.

Figure 6B:
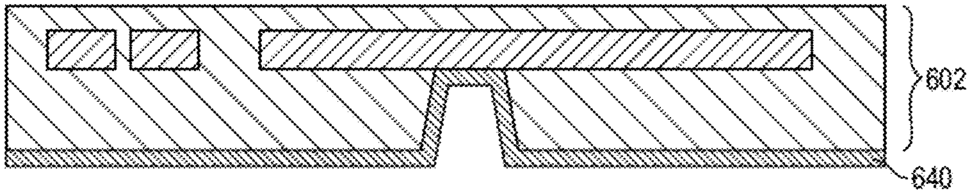

FIG. 6B shows a cross section side view of a stage in the manufacturing process where a silicon nitride layer 640, which may be similar to silicon nitride layer 540 of FIG. 5, is deposited on a side of the substrate 602 and on sides of the cavity 652. In embodiments, an etch process may be used to remove silicon nitride that is next to the exposed portion of the surface of the electrical routings 610.

Figure 6C:
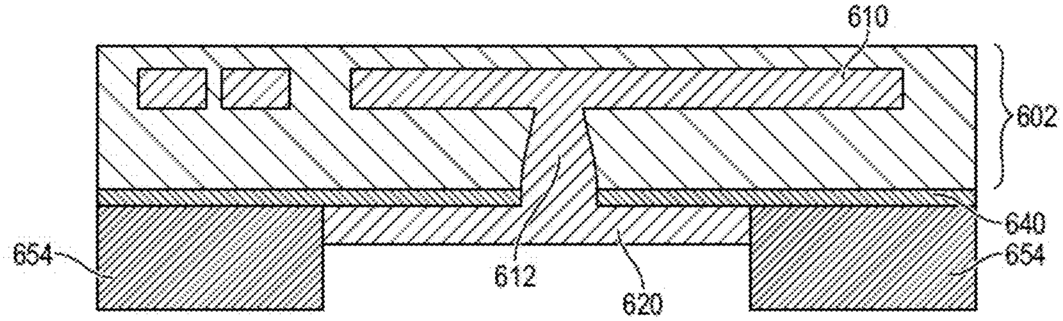

FIG. 6C shows a cross section side view of a stage in the manufacturing process where a sacrificial photodefineable layer 654 is formed on the side of the silicon nitride layer 640, and a copper filled via 612 may be formed through copper deposition. The copper deposition may also be electrically coupled with the electrical routings 610. In embodiments, during the copper deposition process, the metal defined pad 620 is also formed.

Figure 6D:
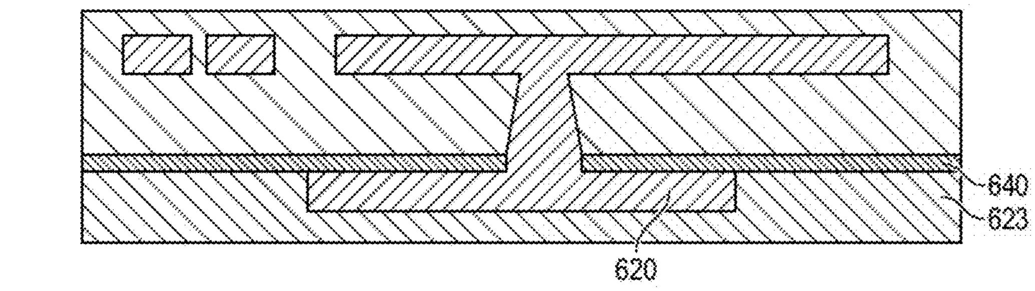

FIG. 6D shows a cross section side view of a stage in the manufacturing process where the sacrificial layer 654 is removed, and a solder resist layer 623 is formed on the silicon nitride layer 640 and the metal defined pad 620.

Figure 6E:
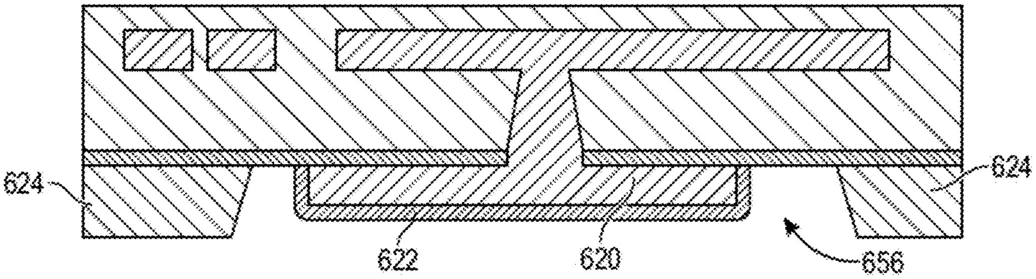

FIG. 6E shows a cross section side view of a stage in the manufacturing process where a cavity 656 is etched in the solder resist layer 623 of FIG. 6D to form solder resist layer 624. In embodiments, a portion of the silicon nitride layer 640 and the metal defined pad 620 is exposed. In embodiments, an ENEPIG layer 622 may be deposited on the metal defined pad 620.

Figure 6F:
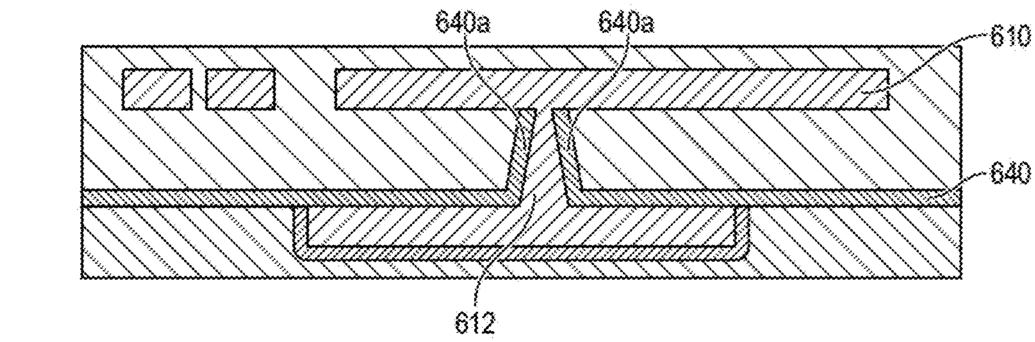

FIG. 6F shows a cross section side view of an alternative stage in the manufacturing process with respect to FIG. 6C, where instead of etching away all of the silicon nitride layer 640 on the bottom and sides of the cavity 652, only the silicon nitride adjacent to the electrical routings 610 is etched away, and silicon nitride layer 640*a* are kept on the side of the cavity 652 when the copper filled via 612 is formed.

Figure 7A:
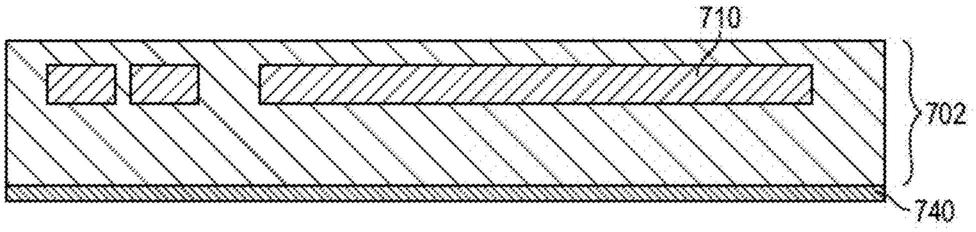
FIGS. 7A-7G illustrate cross section side views of stages in another manufacturing process for creating a layer of silicon nitride between an LGA pad and a dielectric, in accordance with various embodiments.

FIGS. 7A-7G illustrate cross section side views of stages in another manufacturing process for creating a layer of silicon nitride between an LGA pad and a dielectric, in accordance with various embodiments. FIG. 7A shows a cross section side view of a stage in the manufacturing process where a substrate 702 is provided, that includes electrical routings 710, which may be similar to electrical routings 510 of FIG. 5. In embodiments, a layer of silicon nitride 740, which may be similar to silicon nitride layer 540 of FIG. 5 is deposited on a side of the substrate 702. In embodiments, the layer of silicon nitride 740 may have a thickness that may range from 50 nm to 1 μm.

Figure 7B:
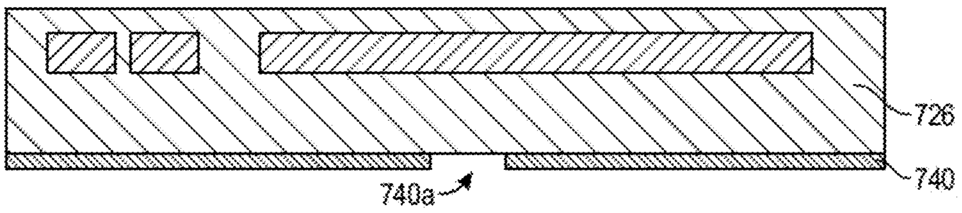

FIG. 7B shows a cross section side view of a stage in the manufacturing process where an opening 740*a* may be etched into the layer of silicon nitride 740. In embodiments, the opening 740*a* may extend to a dielectric 726 of the substrate 702.

Figure 7C:
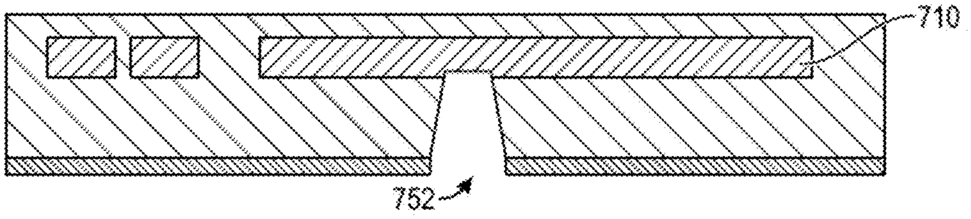

FIG. 7C shows a cross section side view of the stage in the manufacturing process where the cavity 752 is drilled into the dielectric 726 proximate to the opening 740*a*.

Figure 7D:
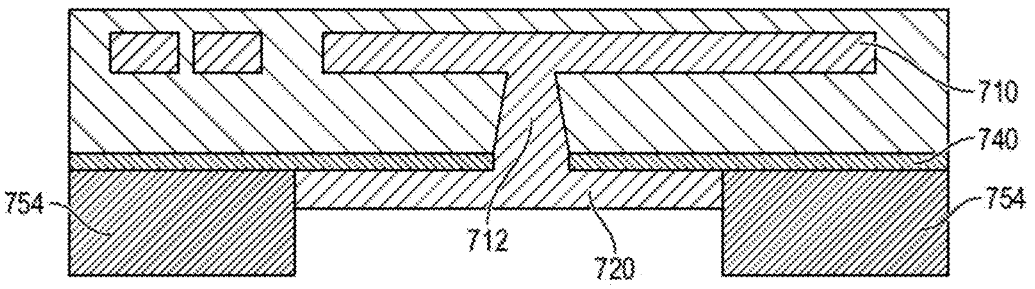

FIG. 7D shows a cross section side view of a stage in the manufacturing process where a sacrificial layer 754 is formed on the side of the layer of silicon nitride 740, and a copper filled via 712 may be formed through copper deposition. The copper filled via 712 may also be electrically coupled with the electrical routings 710. In embodiments, during the copper deposition process, the metal defined pad 720 is also formed.

Figure 7E:
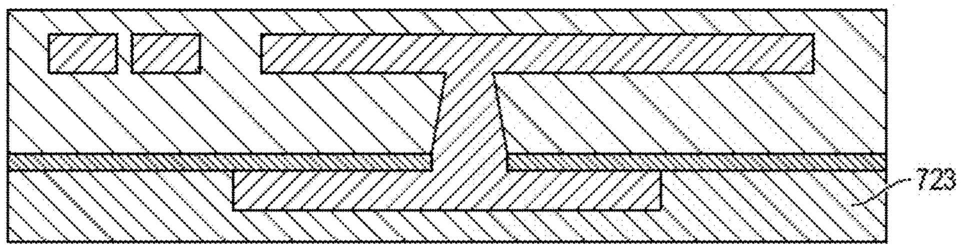

FIG. 7E shows a cross section side view of a stage in the manufacturing process where the sacrificial layer 754 is removed, and a solder resist layer 723 is formed on the layer of silicon nitride 740 and the metal defined pad 720.

Figure 7F:
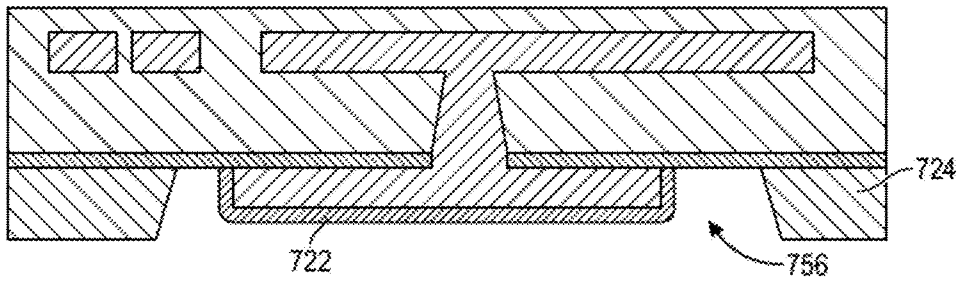

FIG. 7F shows a cross section side view of a stage in the manufacturing process where a cavity 756 is etched into the solder resist layer 723 of FIG. 7E to form solder resist layer 724. In embodiments, a portion of the silicon nitride layer 740 and the metal defined pad 720 is exposed. In embodiments, an ENEPIG layer 722 may be deposited on the metal defined pad 720.

Figure 7G:
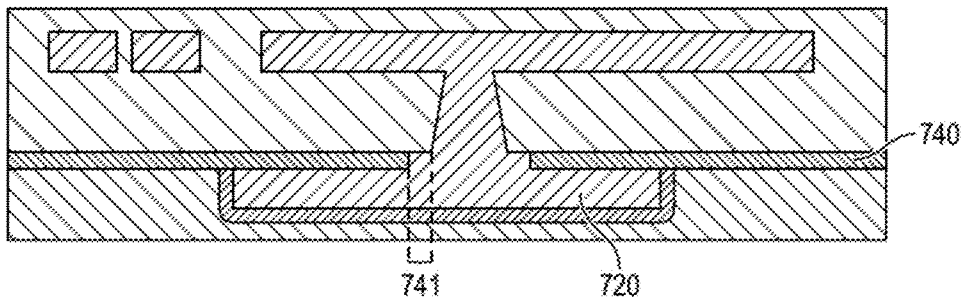

FIG. 7G shows a cross section side view of a stage in the manufacturing process that may be similar to the stage of FIG. 7F, with additional detail. In embodiments, the layer of silicon nitride 740 may start at a distance 741 from the copper via 712. In embodiments, the distance 741 may range from 50 nm to 10 μm. In embodiments, a distance 741 may separate the layer of silicon nitride 740 from the electrical routing 710. In embodiments, the distance 741 may range from 20 μm to 35 μm. In embodiments, a thickness of the ENEPIG layer 722 may range from 1 to 10 μm, and a thickness of the layer of silicon nitride 740 may be on the order of 50 nm.

Figure 8:
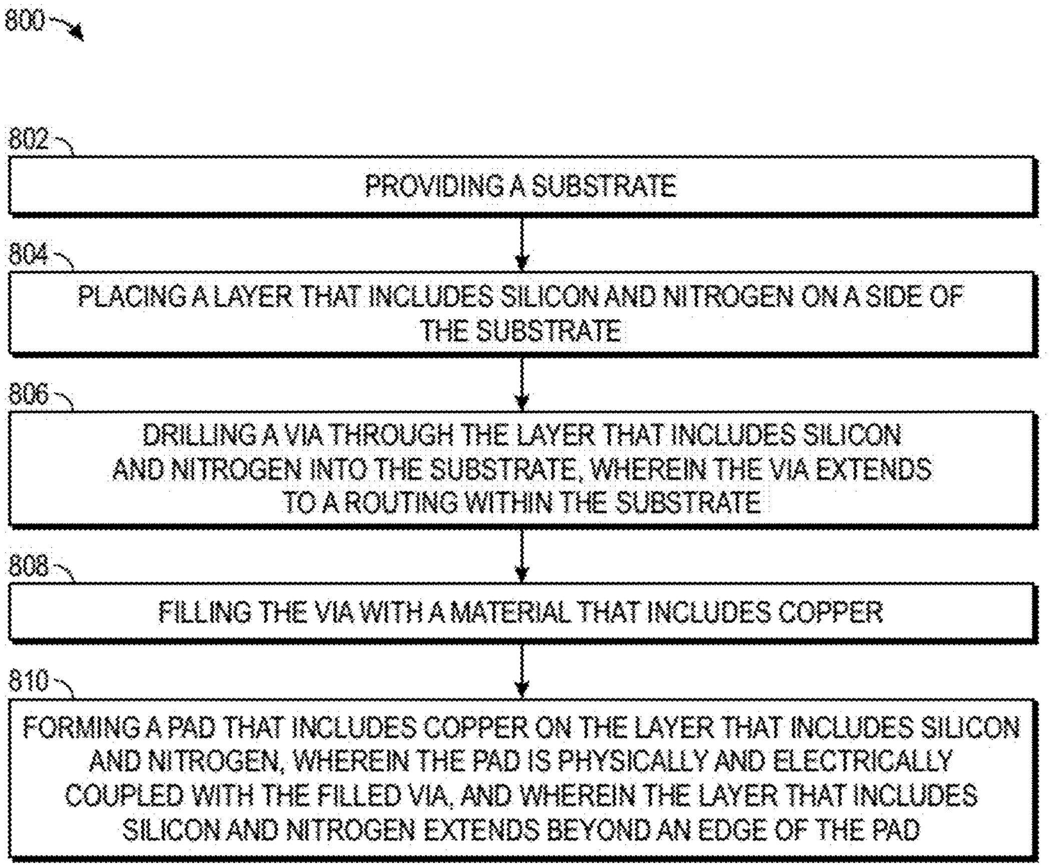
FIG. 8 illustrates an example process for creating a layer of silicon nitride between an LGA pad and a dielectric, in accordance with various embodiments.

FIG. 8 illustrates an example of a process for creating a layer of silicon nitride between an LGA pad and a dielectric, in accordance with various embodiments. In embodiments, process 800 may be performed using the techniques, systems, apparatus, process, and materials described herein, and in particular with respect to FIGS. 1-7G.

At block 802, the process may include providing a substrate. In embodiments, the substrate may be similar to substrate 702 of FIG. 7A, or substrate 202 of FIG. 2.

At block 804, the process may further include placing a layer that includes silicon and nitrogen on a side of the substrate. In embodiments, the layer that includes silicon and nitrogen may be similar to silicon nitride layer 540 of FIG. 5, silicon nitride layer 640 of FIG. 6B, or silicon nitride layer 740 of FIG. 7A.

At block 806, the process may further include drilling a via through the layer that includes silicon and nitrogen into the substrate, wherein the via extends to a routing within the substrate. In embodiments, the via may be similar to cavity 752, and the routing may be similar to electrical routing feature 710 of FIG. 7C.

At block 808, the process may further include filling the via with a material that includes copper. In embodiments, the via filled with the material that includes copper may be similar to copper filled via 712 of FIG. 7D.

At block 810, the process may further include forming a pad that includes copper on the layer that includes silicon and nitrogen, wherein the pad is physically and electrically coupled with the filled via, and wherein the layer that includes silicon and nitrogen extends beyond an edge of the pad. In embodiments, the pad may include metal defined pad 720 of FIG. 7D.

Figure 9:
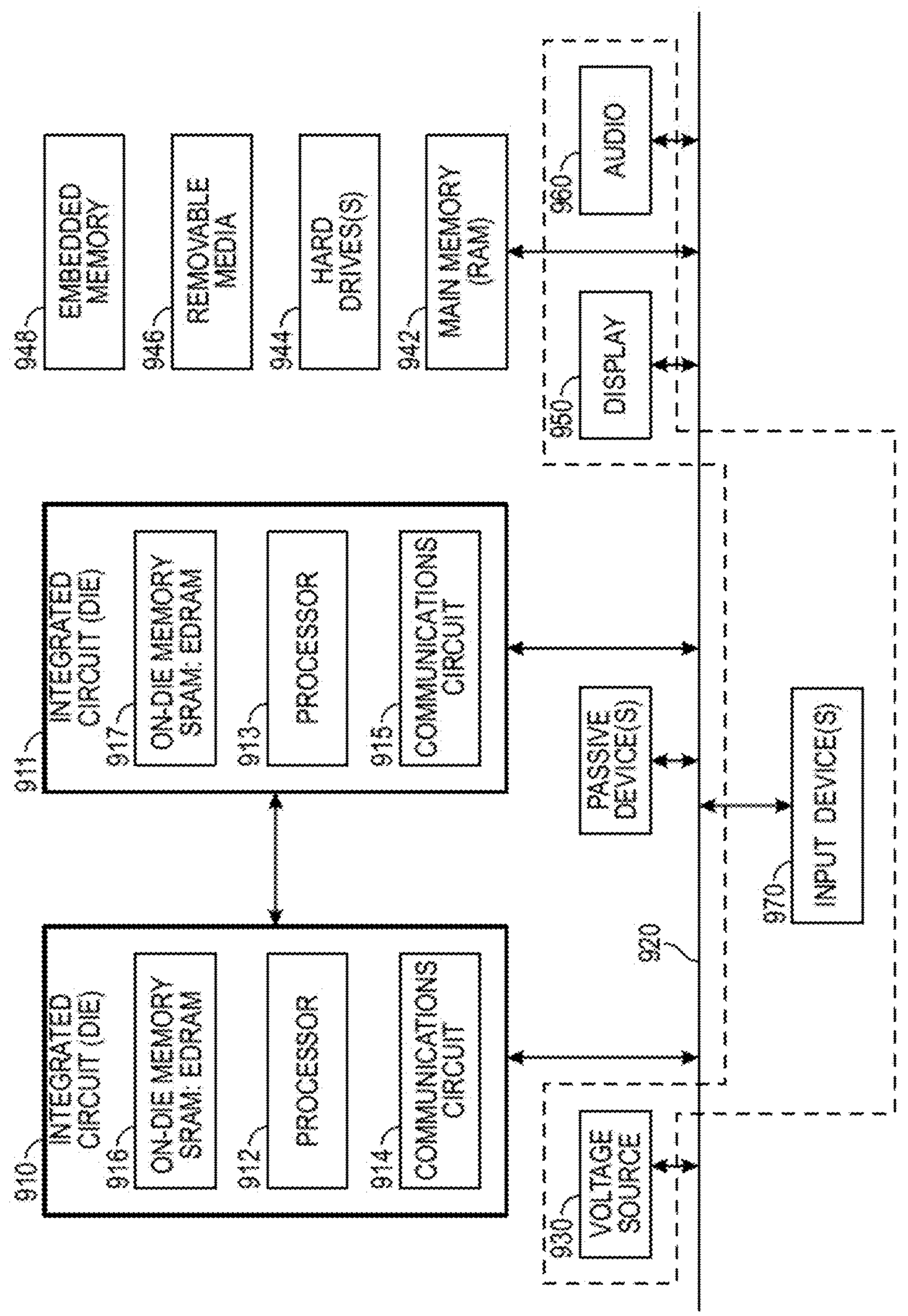
FIG. 9 schematically illustrates a computing device, in accordance with various embodiments.

FIG. 9 is a schematic of a computer system 900, in accordance with an embodiment of the present invention. The computer system 900 (also referred to as the electronic system 900) as depicted can embody silicon nitride layer under a copper pad, according to any of the several disclosed embodiments and their equivalents as set forth in this disclosure. The computer system 900 may be a mobile device such as a netbook computer. The computer system 900 may be a mobile device such as a wireless smart phone. The computer system 900 may be a desktop computer. The computer system 900 may be a hand-held reader. The computer system 900 may be a server system. The computer system 900 may be a supercomputer or high-performance computing system.

In an embodiment, the electronic system 900 is a computer system that includes a system bus 920 to electrically couple the various components of the electronic system 900. The system bus 920 is a single bus or any combination of busses according to various embodiments. The electronic system 900 includes a voltage source 930 that provides power to the integrated circuit 910. In some embodiments, the voltage source 930 supplies current to the integrated circuit 910 through the system bus 920.

The integrated circuit 910 is electrically coupled to the system bus 920 and includes any circuit, or combination of circuits according to an embodiment. In an embodiment, the integrated circuit 910 includes a processor 912 that can be of any type. As used herein, the processor 912 may mean any type of circuit such as, but not limited to, a microprocessor, a microcontroller, a graphics processor, a digital signal processor, or another processor. In an embodiment, the processor 912 includes, or is coupled with, silicon nitride layer under a copper pad, as disclosed herein. In an embodiment, SRAM embodiments are found in memory caches of the processor. Other types of circuits that can be included in the integrated circuit 910 are a custom circuit or an application-specific integrated circuit (ASIC), such as a communications circuit 914 for use in wireless devices such as cellular telephones, smart phones, pagers, portable computers, two-way radios, and similar electronic systems, or a communications circuit for servers. In an embodiment, the integrated circuit 910 includes on-die memory 916 such as static random-access memory (SRAM). In an embodiment, the integrated circuit 910 includes embedded on-die memory 916 such as embedded dynamic random-access memory (eDRAM).

In an embodiment, the integrated circuit 910 is complemented with a subsequent integrated circuit 911. Useful embodiments include a dual processor 913 and a dual communications circuit 915 and dual on-die memory 917 such as SRAM. In an embodiment, the dual integrated circuit 910 includes embedded on-die memory 917 such as eDRAM.

In an embodiment, the electronic system 900 also includes an external memory 940 that in turn may include one or more memory elements suitable to the particular application, such as a main memory 942 in the form of RAM, one or more hard drives 944, and/or one or more drives that handle removable media 946, such as diskettes, compact disks (CDs), digital variable disks (DVDs), flash memory drives, and other removable media known in the art. The external memory 940 may also be embedded memory 948 such as the first die in a die stack, according to an embodiment.

In an embodiment, the electronic system 900 also includes a display device 950, an audio output 960. In an embodiment, the electronic system 900 includes an input device such as a controller 970 that may be a keyboard, mouse, trackball, game controller, microphone, voice-recognition device, or any other input device that inputs information into the electronic system 900. In an embodiment, an input device 970 is a camera. In an embodiment, an input device 970 is a digital sound recorder. In an embodiment, an input device 970 is a camera and a digital sound recorder.

As shown herein, the integrated circuit 910 can be implemented in a number of different embodiments, including a package substrate having silicon nitride layer under a copper pad, according to any of the several disclosed embodiments and their equivalents, an electronic system, a computer system, one or more methods of fabricating an integrated circuit, and one or more methods of fabricating an electronic assembly that includes a package substrate having silicon nitride layer under a copper pad, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having silicon nitride layer under a copper pad embodiments and their equivalents. A foundation substrate may be included, as represented by the dashed line of FIG. 9. Passive devices may also be included, as is also depicted in FIG. 9.

EXAMPLES

The following paragraphs describe examples of various embodiments.

Example 1 is a substrate comprising: an electrically conductive pad on a first layer of the substrate; an electrically conductive feature in the first layer of the substrate, the electrically conductive feature electrically coupled with the electrically conductive pad; an electrically conductive routing in a second layer of the substrate, wherein the electrically conductive routing is electrically coupled with the electrically conductive feature; and a layer that includes silicon and nitrogen adjacent to the electrically conductive pad.

Example 2 includes the substrate of example 1, or of any example or embodiment described herein, wherein the layer that includes silicon and nitrogen is at least partially between the electrically conductive pad and the electrically conductive routing in the second layer of the substrate.

Example 3 includes the substrate of example 1, or of any example or embodiment described herein, wherein the second layer of the substrate is adjacent to the first layer of the substrate.

Example 4 includes the substrate of example 1, or of any example or embodiment described herein, wherein a thickness of the layer that includes silicon and nitrogen ranges between 50 nm and 1 μm.

Example 5 includes the substrate of example 1, or of any example or embodiment described herein, wherein the layer that includes silicon and nitrogen extends along the first layer of the substrate beyond an edge of the electrically conductive pad.

Example 6 includes the substrate of example 1, or of any example or embodiment described herein, wherein the layer that includes silicon and nitrogen includes a silicon nitride.

Example 7 includes the substrate of example 6, or of any example or embodiment described herein, wherein the silicon nitride includes $Si_xN_y$, wherein X and Y are integers greater than zero, and wherein X is a multiple of three and Y is a multiple of four.

Example 8 includes the substrate of example 1, or of any example or embodiment described herein, further comprising a layer that includes silicon and nitrogen coupled with at least a portion of the electrically conductive feature in the first layer of the substrate.

Example 9 includes the substrate of example 1, or of any example or embodiment described herein, further comprising a layer on the first layer of the substrate, wherein the layer is on a same side as the electrically conductive pad, wherein the layer is separated from the electrically conductive pad by at least a distance D along the side of the first layer, and wherein the distance D is greater than zero.

Example 10 includes the substrate of example 9, or of any example or embodiment described herein, wherein the layer on the first layer of the substrate is a dielectric.

Example 11 includes the substrate of example 1, or of any example or embodiment described herein, wherein the electrically conductive pad includes copper.

Example 12 includes the substrate of example 1, or of any example or embodiment described herein, wherein the electrically conductive pad is at a surface of the substrate.

Example 13 includes the substrate of example 12, or of any example or embodiment described herein, further comprising a layer on a surface of the electrically conductive pad that includes a selected one or more of: nickel, palladium, or gold.

Example 14 includes the substrate of example 13, or of any example or embodiment described herein, wherein the layer on the surface of the electrically conductive pad is an ENEPIG.

Example 15 includes the substrate of example 1, or of any example or embodiment described herein, wherein a plane of the electrically conductive pad and a plane of the electrically conductive routing are substantially parallel to each other.

Example 16 includes the substrate of example 1, or of any example or embodiment described herein, wherein the electrically conductive pad is a portion of a landing grid array.

Example 17 includes the substrate of example 1, or of any example or embodiment described herein, wherein the electrically conductive feature and the electrically conductive routing include copper.

Example 18 is a package comprising: a die; a substrate with a first side and a second side opposite the first side, the die physically and electrically coupled with the second side of the substrate, the substrate further comprising: a copper pad on the first side of the substrate; and a layer that includes silicon and nitrogen adjacent to the copper pad, wherein the layer that includes silicon and nitrogen is at least partially between the copper pad and the first side of the substrate.

Example 19 includes the package of example 18, or of any example or embodiment described herein, wherein the layer that includes silicon and nitrogen extends along the first side of the substrate past an edge of the copper pad.

Example 20 includes the package of example 18, or of any example or embodiment described herein, further comprising another layer on the first side of the substrate, wherein the another layer is on a same side as the copper pad, wherein the another layer is separated from the copper pad by at least a distance D along the side of the first side of the substrate, and wherein the distance D is greater than zero.

Example 21 includes the package of example 20, or of any example or embodiment described herein, wherein the another layer is a dielectric.

Example 22 includes the package of example 18, or of any example or embodiment described herein, wherein the copper pad is a plurality of copper pads.

Example 23 is a method comprising: providing a substrate; and placing a layer that includes silicon and nitrogen on a side of the substrate; drilling a via through the layer that includes silicon and nitrogen into the substrate, wherein the via extends to a routing within the substrate; filling the via with a material that includes copper; and forming a pad that includes copper on the layer that includes silicon and nitrogen, wherein the pad is physically and electrically coupled with the filled via, and wherein the layer that includes silicon and nitrogen extends beyond an edge of the pad.

Example 24 includes the method of example 23, or of any example or embodiment described herein, further comprising coating a portion of a surface of the pad with a layer that includes a selected one or more of: nickel, palladium, or gold.

Example 25 includes the method of example 23, or of any example or embodiment described herein, wherein the layer that includes silicon and nitrogen further includes silicon nitride.

Various embodiments may include any suitable combination of the above-described embodiments including alternative (or) embodiments of embodiments that are described in conjunctive form (and) above (e.g., the “and” may be “and/or”). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

What is claimed is:

1. A substrate comprising:

an electrically conductive pad on a first layer of the substrate;

an electrically conductive feature in the first layer of the substrate, the electrically conductive feature electrically coupled with the electrically conductive pad;

an electrically conductive routing in a second layer of the substrate, wherein the electrically conductive routing is electrically coupled with the electrically conductive feature; and a layer that includes silicon and nitrogen adjacent to and in direct contact with the electrically conductive pad, the layer in direct contact with the electrical routing.

2. The substrate of claim 1, wherein the layer that includes silicon and nitrogen is at least partially between the electrically conductive pad and the electrically conductive routing in the second layer of the substrate.

3. The substrate of claim 1, wherein the second layer of the substrate is adjacent to the first layer of the substrate.

4. The substrate of claim 1, wherein a thickness of the layer that includes silicon and nitrogen ranges between 50 nm and 1 μm.

5. The substrate of claim 1, wherein the layer that includes silicon and nitrogen extends along the first layer of the substrate beyond an edge of the electrically conductive pad.

6. The substrate of claim 1, wherein the layer that includes silicon and nitrogen includes a silicon nitride.

7. The substrate of claim 6, wherein the silicon nitride includes $Si_xN_y$, wherein X and Y are integers greater than zero, and wherein X is a multiple of three and Y is a multiple of four.

8. The substrate of claim 1, further comprising a layer on the first layer of the substrate, wherein the layer is on a same side as the electrically conductive pad, wherein the layer is separated from the electrically conductive pad by at least a distance D along the side of the first layer, and wherein the distance D is greater than zero.

9. The substrate of claim 8, wherein the layer on the first layer of the substrate is a dielectric.

10. The substrate of claim 1, wherein the electrically conductive pad includes copper.

11. The substrate of claim 1, wherein the electrically conductive pad is at a surface of the substrate.

12. The substrate of claim 11, further comprising a layer on a surface of the electrically conductive pad that includes a selected one or more of: nickel, palladium, or gold.

13. The substrate of claim 12, wherein the layer on the surface of the electrically conductive pad is an ENEPIG.

14. The substrate of claim 1, wherein a plane of the electrically conductive pad and a plane of the electrically conductive routing are substantially parallel to each other.

15. The substrate of claim 1, wherein the electrically conductive pad is a portion of a landing grid array.

16. The substrate of claim 1, wherein the electrically conductive feature and the electrically conductive routing include copper.

17. A package comprising:

a die;

a substrate with a first side and a second side opposite the first side, the die physically and electrically coupled with the second side of the substrate, the substrate further comprising:

a copper pad on the first side of the substrate;

an electrically conductive feature electrically coupled with the copper pad;

an electrically conductive routing electrically coupled with the electrically conductive feature; and a layer that includes silicon and nitrogen adjacent to the copper pad, wherein the layer that includes silicon and nitrogen is at least partially between the copper pad and the first side of the substrate, the layer in direct contact with the electrical routing.

18. The package of claim 17, wherein the layer that includes silicon and nitrogen extends along the first side of the substrate past an edge of the copper pad.

19. The package of claim 17, further comprising another layer on the first side of the substrate, wherein the another layer is on a same side as the copper pad, wherein the another layer is separated from the copper pad by at least a distance D along the side of the first side of the substrate, and wherein the distance D is greater than zero.

20. The package of claim 19, wherein the another layer is a dielectric.

21. The package of claim 17, wherein the copper pad is a plurality of copper pads.

22. A method comprising:

providing a substrate;

placing a layer that includes silicon and nitrogen on a side of the substrate;

drilling a via through the layer that includes silicon and nitrogen into the substrate, wherein the via extends to a routing within the substrate;

filling the via with a material that includes copper; and forming a pad that includes copper on the layer that includes silicon and nitrogen, wherein the pad is physically and electrically coupled with the filled via, wherein the layer that includes silicon and nitrogen extends beyond an edge of the pad, and wherein the layer that includes silicon and nitrogen is in direct contact with the routing and in direct contact with the pad.

23. The method of claim 22, further comprising coating a portion of a surface of the pad with a layer that includes a selected one or more of: nickel, palladium, or gold.

24. The method of claim 22, wherein the layer that includes silicon and nitrogen further includes silicon nitride.

* * * * *